(12) United States Patent
Whitaker et al.

(10) Patent No.: US 11,860,685 B2
(45) Date of Patent: Jan. 2, 2024

(54) CLOCK FREQUENCY DIVIDER CIRCUIT

(71) Applicant: Advanced Micro Devices, Inc., Santa Clara, CA (US)

(72) Inventors: Luke Jereme Whitaker, Fort Collins, CO (US); Edoardo Prete, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 31 days.

(21) Appl. No.: 17/514,723

(22) Filed: Oct. 29, 2021

(65) Prior Publication Data

US 2023/0136815 A1    May 4, 2023

(51) Int. Cl.
*G06F 1/28* (2006.01)
*G06F 1/08* (2006.01)
*H03K 17/693* (2006.01)
*H03K 23/00* (2006.01)

(52) U.S. Cl.
CPC .............. *G06F 1/08* (2013.01); *H03K 17/693* (2013.01); *H03K 23/00* (2013.01)

(58) Field of Classification Search
CPC ......... G06F 1/08; H03K 17/693; H03K 23/00
See application file for complete search history.

(56) References Cited

U.S. PATENT DOCUMENTS

| | | | |
|---|---|---|---|
| 5,936,059 A | 8/1999 | Zaid | |
| 6,393,502 B1 | 5/2002 | Meyer et al. | |
| 7,167,535 B2 | 1/2007 | Sachse et al. | |
| 8,373,472 B2 | 2/2013 | Thaller et al. | |
| 10,250,372 B2 | 4/2019 | Feuersaenger et al. | |
| 11,581,881 B1* | 2/2023 | Azad | H03K 19/20 |
| 2007/0086267 A1* | 4/2007 | Kwak | G11C 7/22 |
| | | | 365/233.1 |
| 2011/0128051 A1* | 6/2011 | Kumar | G06F 1/08 |
| | | | 327/115 |
| 2013/0232371 A1* | 9/2013 | Shimizu | H04L 7/033 |
| | | | 713/400 |

* cited by examiner

*Primary Examiner* — Zahid Choudhury
(74) *Attorney, Agent, or Firm* — KOWERT HOOD MUNYON RANKIN AND GOETZEL PC; Rory D. Rankin (57) ABSTRACT

A system and method for efficiently generating clock signals are described. In various implementations, an integrated circuit includes multiple clock frequency dividers both at its I/O boundaries and across its die. A clock frequency divider utilizes a first clock divider and a second clock divider that receive input clock signals with an initial phase difference between them. The first clock divider and the second clock divider generate output clock signals that have frequencies that are a fraction of the frequencies of the received input clock signals. The second clock divider uses a combined multiplexer and flip-flop (combined mux-flop) circuit. The combined mux-flop circuit receives a reset signal that is asserted asynchronously with respect to an input clock signal received by the second clock divider. The second clock divider generates an output clock signal that has the initial phase difference with an output clock signal of the first clock divider.

20 Claims, 9 Drawing Sheets

*Method 700*

```
┌─────────────────────────────────────────────┐
│ Receive, by a first clock divider, a first  │
│ input clock signal                          │
│                    702                      │
└─────────────────────────────────────────────┘
                     ▼
┌─────────────────────────────────────────────┐
│ Generate, by the first clock divider, a     │
│ first output clock signal based on the      │
│ first input clock signal                    │
│                    704                      │
└─────────────────────────────────────────────┘
                     ▼
┌─────────────────────────────────────────────┐
│ Receive, by a second clock divider, a       │
│ second input clock signal with a same       │
│ frequency as the first input clock signal   │
│                    706                      │
└─────────────────────────────────────────────┘
                     ▼
┌─────────────────────────────────────────────┐
│ Receive, by the second clock divider, a     │
│ first intermediate clock signal based on    │
│ the first output clock signal               │
│                    708                      │
└─────────────────────────────────────────────┘
                     ▼
┌─────────────────────────────────────────────┐
│ Receive, by the second clock divider, a     │
│ reset signal that is asserted               │
│ asynchronously with respect to the second   │
│ clock signal                                │
│                    710                      │
└─────────────────────────────────────────────┘
                     ▼
┌─────────────────────────────────────────────┐
│ Generate, by the second clock divider, a    │
│ second output clock signal based on the     │
│ second input clock signal                   │
│                    712                      │
└─────────────────────────────────────────────┘
                     ▼
┌─────────────────────────────────────────────┐
│ Generate, during a reset period by the      │
│ second clock divider, a second output clock │
│ signal such that a phase difference between │
│ the output clock signals is equal to an     │
│ initial phase difference between the input  │
│ clock signals                               │
│                    714                      │
└─────────────────────────────────────────────┘
```

CLOCK FREQUENCY DIVIDER CIRCUIT

BACKGROUND

Description of the Relevant Art

High-speed networks and computer buses continue to increase demand for bandwidth. The increasing demand for high bandwidth interconnection causes the input/output (I/O) data rates to also increase as well as the number of data signals to transfer. When transferring information between functional blocks in a semiconductor chip, electrical signals are sent on multiple, parallel metal traces. Transmitters in a first functional block send the electrical signals across the parallel metal traces. Receivers in a second functional block receive the electrical signals. In some cases, the two functional blocks are within a same die. In other cases, the two functional blocks are on separate dies. In either case, the metal traces have transmission line effects such as distributed inductance, capacitance and resistance throughout its length. For modern integrated circuits, the interconnect capacitance reduces signal integrity and signal transfer rate more so than gate capacitance of semiconductor devices. For example, the interconnect capacitance per unit length includes both sidewall fringing capacitance and cross-coupling capacitance. Intersymbol interference (ISI) causes jitter for high-speed serial links and results in errors in the decision circuitry at the receiver.

Techniques to handle the above issues and reliably transfer information include one or more of utilizing differential signaling, utilizing improved on-die termination circuitry to reduce signal reflection, and utilizing equalization techniques such as decision feedback equalization (DFE) circuits. Equalization circuitry, such as DFE circuits, used in both a transmitter and a receiver reduce the effects of intersymbol interference. Equalization circuitry use clock frequency dividers. Clock frequency dividers generate output clock signals with a frequency less than a frequency of received input clock signals. These clock frequency dividers are also used in a variety of other circuits. Examples are data deserializers, frequency synthesizers, timing recovery circuits, and clock generators such as phase locked loops (PLLs) and intermediate on-die clock generators across the die. Clock frequency dividers at the PLL affect the feedback path of the PLL, which determines a latency for locking the PLL. Additionally, the on-die circuits require the clock signal outputs from the one or more PLLs to have phase alignment.

A variety of types of sequential circuits receive an input clock signal and additionally an input data signal or an input control signal. These types of sequential circuits synchronize the processing of data signals or control signals in a pipelined fashion. Examples of these sequential circuits are latches, flip-flops, word line drivers, bit line drives, and so on. Generally, sequential circuits have an associated overhead including a setup time and a hold time. When either the setup time or the hold time is violated, the signals within the sequential circuit and an associated output value become metastable, or unpredictable. If the output value settles to an incorrect value, data corruption occurs. However, even if the output value settles to a correct value, power consumption has increased. Additionally, the latency increases for the circuitry of the subsequent combinatorial logic that receives the output value. Therefore, the design of the clock frequency dividers both at the I/O boundary and within the die of an integrated circuit is critical in order to support a broad frequency range, reduce on-die area, reduce power consumption, increase performance, and decreases a number of failures, which increases system reliability.

In view of the above, methods and systems for efficiently generating clock signals are desired.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for efficiently generating clock signals are contemplated. An integrated circuit includes multiple clock frequency dividers both at its I/O boundaries and across its die. Clock frequency dividers generate output clock signals with a frequency less than a frequency of received input clock signals. In various implementations, one or more of the clock frequency dividers utilize a first clock divider and a second clock divider. The first clock divider receives a first input clock signal, and the second clock divider receives a second input clock signal. In various implementations, a first input frequency of the first input clock signal is equal to a second input frequency of the second input clock signal. The first input clock signal and the second input clock signal have a phase difference between them. In some designs, the phase difference is zero degrees. When the two signals have phase alignment, the two signals also have a phase difference of zero degrees. In other designs, the phase difference is a positive, non-zero number of degrees. In these designs, the two signals do not have phase alignment.

As used herein, two signals that have phase alignment refers to the two signals having a phase difference of zero degrees. The two signals having phase alignment satisfy at least one of two conditions. The first condition is the rising edges of the two signals occur at the same time. A second condition is the falling edges of the two signals occur at the same time. When the first signal and the second signal have a same frequency, the first signal and the second signal satisfy both the first condition and the second condition. In other words, each of the rising edges of the first signal and the second signal occur at the same time. Similarly, when the first signal and the second signal have the same frequency and have phase alignment, each of the falling edges of the first signal and the second signal occur at the same time.

Since the input clock frequencies of the first input clock signal and the second input clock signal are the same, when the first input clock signal has phase alignment with the second input clock signal, the first input clock signal and the second input clock signal satisfy each of the above two conditions. However, in other designs, the first input clock signal does not have phase alignment with the second input clock signal. Therefore, the first clock signal and the second clock signal have a phase difference between them that is a positive, non-zero number of degrees. For example, the first clock signal and the second clock signal have a phase difference of 90 degrees, 180 degrees, or 270 degrees. A variety of other positive, non-zero number of degrees of phase difference are possible and contemplated between the first clock signal and the second clock signal. Since the input clock frequencies of the first input clock signal and the second input clock signal are the same, when the first clock signal and the second clock signal do not have phase alignment, the first input clock signal and the second input clock signal fail to satisfy each of the above two conditions. In other words, the rising edges of the first input clock signal and the second input clock signal occur at different times. Additionally, since the input clock frequencies are the same and the two input clock signals do not have phase alignment, the falling edges of the first input clock signal and the second input clock signal occur at different times.

The first clock divider generates the first output clock signal with a frequency that is a fraction of the frequency of the first input clock signal. This fraction is a positive, non-zero ratio that is less than one. Therefore, the frequency of the first output clock signal is less than the frequency of the first input clock signal. Similarly, the second clock divider generates the second output clock signal with a frequency that is a fraction of the frequency of the second input clock signal. In various implementations, the first output clock signal has a same frequency as the second output clock signal. For example, each of the first clock divider and the second clock divider halve the frequencies of their respective input clock signals when generating the respective output clock signals. Therefore, the first output clock signal has a frequency that is one half of the frequency of the first input clock signal. A same relationship exists between the second output clock signal and the second input clock signal. In other implementations, the first output clock signal has a different frequency than the second output clock signal. For example, the first clock divider divides the first input clock frequency by two, whereas, the second clock divider divides the second input clock frequency by four. Therefore, the first output clock signal has a frequency that is one half of the frequency of the first input clock signal, but the second output clock signal has a frequency that is one fourth of the frequency of the second input clock signal. Other positive, non-zero divisors used by the first clock divider and the second clock divider are possible and contemplated for generating the respective output clock signals.

The second clock divider receives a first intermediate clock signal based on the first output clock signal. In an implementation, the first intermediate clock signal is a pipelined version of the first output clock signal. For example, one or more flip-flop circuits are used between the first clock divider and the second clock divider. The second clock divider receives a reset signal that is asserted asynchronously with respect to the second input clock signal. Therefore, no synchronization circuitry is used between the reset signal and the second clock divider. The second clock divider uses a combined multiplexer and flip-flop (combined mux-flop) circuit. The multiplexer of the combined mux-flop circuit receives, as a first data input signal, an inverted version of the first output clock signal, and receives, as a second data input signal, a delayed version of the second output clock signal. The multiplexer additionally receives the reset signal as a select input signal.

The combined mux-flop circuit uses pass gates to convey data through the multiplexer to the flip-flop circuit. For example, the flip-flop circuit receives, with a pass gate, an output value from one of two pass gates of the multiplexer selected by the reset signal. The initial states and subsequent states of the first output clock signal and the second output clock signal are unknown between power up of the clock frequency divider and completion of a reset period. Accordingly, until the reset period completes, it is unknown whether an additional phase difference is added to the initial phase difference between the first and second input clock signals. In one example, after power up, the first and second input clock signals have an initial phase difference of zero degrees. However, after power up, the first clock divider generates an output state equal to a binary '1', whereas, the second clock divider generates an output state equal to a binary '0," which causes an additional phase difference of 180 degrees. Therefore, until the reset period completes after power up, the first and second output clock signals have a phase difference of 180 degrees, rather than a phase difference of zero degrees equal to the initial phase difference between the first and second input clock signals.

During the reset period when the reset signal is asserted, the combined mux-flop circuit of the second clock divider performs steps to generate the second output clock signal such that the first and second output clock signals have a phase difference equal to the initial phase difference between the first and second input clock signals. When the reset signal is negated and the reset period completes, it is known that the first and second output clock signals have a phase difference between them that is equal to the initial phase difference between the first and second input clock signals.

Figure 1:
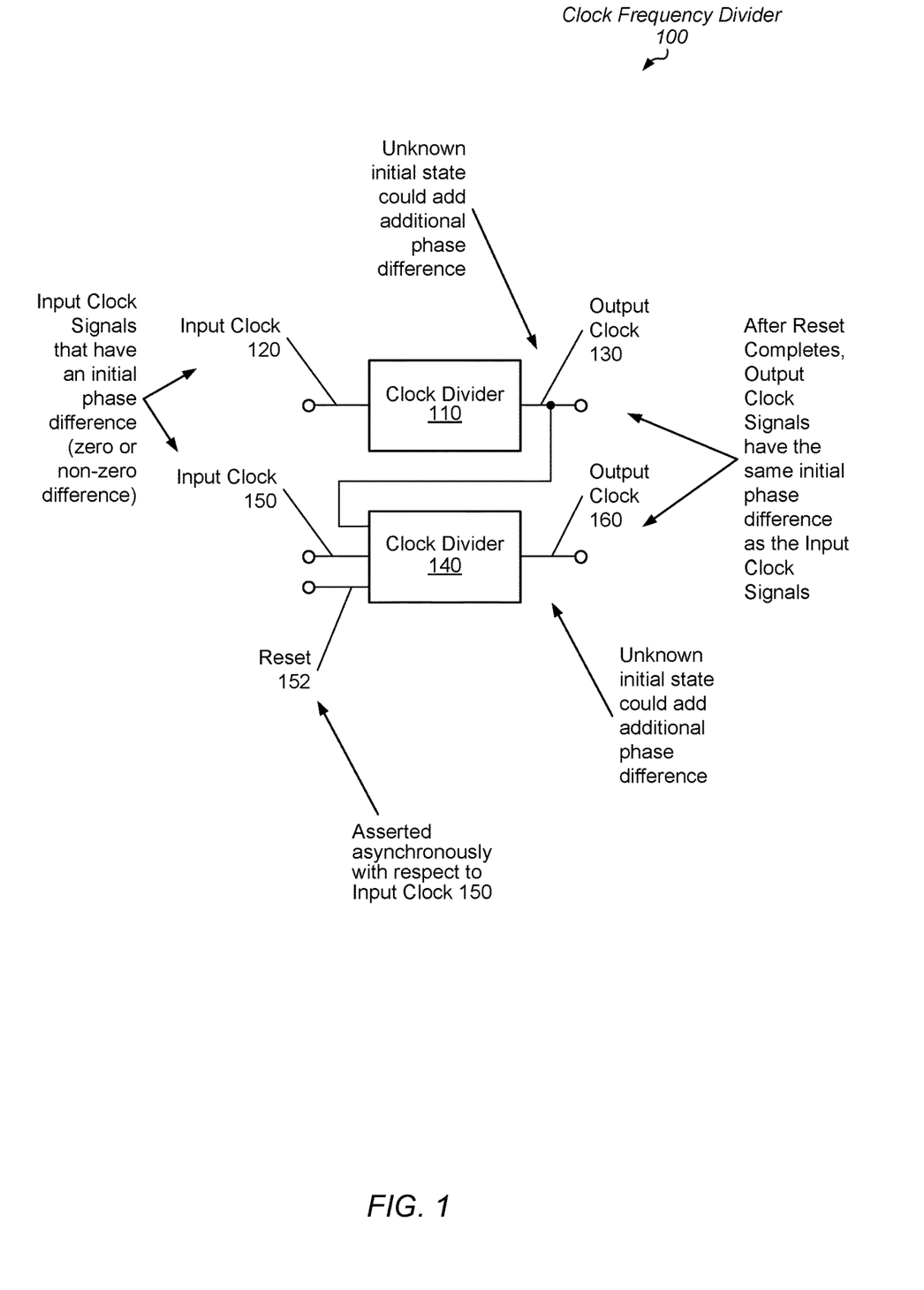
FIG. 1 is a generalized diagram of a clock frequency divider.

Turning now to FIG. 1, a generalized block diagram of a clock frequency divider 100 is shown. An integrated circuit includes multiple clock frequency dividers such as the clock frequency divider 100. The integrated circuit is capable of using the clock frequency divider 100 at its I/O boundaries or across its die. For example, the integrated circuit uses the clock frequency divider 100 in one or more of a decision feedback equalization (DFE) circuits, data deserializers, frequency synthesizers, timing recovery circuits, and clock generators such as phase locked loops (PLLs) and intermediate on-die clock generators across the die. As shown, the clock frequency divider 100 includes a clock divider 110 and another clock divider 140 that receives an output of the clock divider 110. The clock divider 110 is also referred to as a master clock divider, and the clock divider 140 is also referred to as a slave clock divider. The clock frequency divider 100 receives two clock input signals such as the input clock signal 120 and the input clock signal 150, and generates two output clock signals such as output clock signal 130 and output clock signal 160. The clock frequency divider 100 additionally receives the reset signal 152, which is used by the clock divider 140 to generate the output clock signal 160. The reset signal 152 is asserted asynchronously with respect to the input clock signal 150.

In various implementations, the frequency of the input clock signal 120 is equal to the frequency of the input clock signal 150. In some designs, the input clock signal 120 has phase alignment with the input clock signal 150, whereas, in other designs, the input clock signal 120 does not have phase alignment with the input clock signal 150. The output clock signal 130 has a frequency that is a fraction of the frequency of the input clock signal 120. This fraction is a positive, non-zero ratio that is less than one. In other words, the frequency of the output clock signal 130 is less than the frequency of the input clock signal 120. Similarly, the output clock signal 160 has a frequency that is less than the frequency of the input clock signal 150. In some implementations, the output clock signal 130 has a same frequency as the output clock signal 160. For example, each of the clock divider 110 and the clock divider 140 uses a same positive, non-zero divisor for generating the output clock signals 130 and 160. In other implementations, the output clock signal 130 has a different frequency than the output clock signal 160. For example, the clock divider 110 and the clock divider 140 use different positive, non-zero divisors for generating the output clock signals 130 and 160.

The initial state of the output clock signal 130 generated by the clock divider 110 is unknown. Similarly, the initial state of the output clock signal 160 generated by the clock divider 140 is unknown. Therefore, the initial states and subsequent states of the output clock signals 130 and 160 are unknown between power up of the clock frequency divider 100 and completion of a reset period. Accordingly, until the reset period completes, it is unknown whether an additional phase difference is added to the initial phase difference between the first and second input clock signals 120 and 150. In one example, after power up, the first and second input clock signals 120 and 150 have an initial phase difference of 90 degrees. However, after power up, the first clock divider generates an output state equal to a binary '0', whereas, the second clock divider generates an output state equal to a binary '1,' which causes an additional phase difference of 180 degrees. Therefore, until the reset period completes after power up, the first and second output clock signals 130 and 160 have a phase difference of 270 degrees, rather than a phase difference of 90 degrees equal to the initial phase difference between the first and second input clock signals 120 and 150.

Typically, external circuitry asserts the reset signal 152 for a number of clock periods of the input clock signal 150. This number of clock periods of the input clock signal 150 is dependent on design requirements that are set to minimize the parameter Mean Time Between Failures, or MTBF. This parameter indicates an average time interval between two successive failures of a particular element on a chip. The external circuitry asserts the reset signal 152 in an asynchronous manner with respect to the input clock signal 150. Each of the external circuitry and the clock frequency divider 100 does not use synchronizers to synchronously assert the reset signal 152 with respect to the input clock signal 150 due to timing requirements of the sequential elements used by the clock dividers 110 and 140. The clock divider 140 includes circuitry that performs steps to generate the output clock signal 160 such that the first and second output clock signals 130 and 160 have a phase difference equal to the initial phase difference between the first and second input clock signals 120 and 150. The clock divider 140 performs these steps while still meeting timing requirements of the clock dividers 110 and 140.

Figure 2:
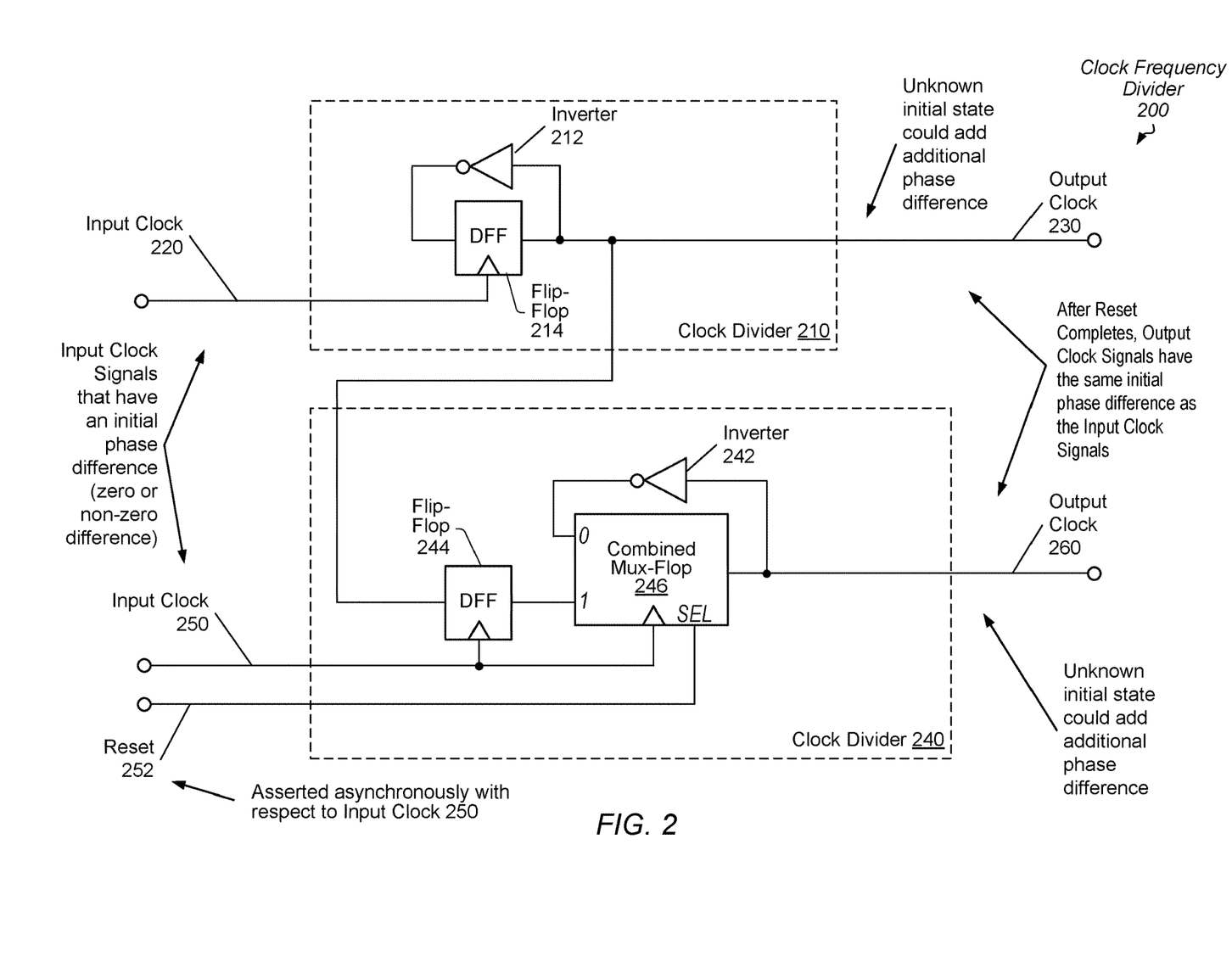
FIG. 2 is a generalized diagram of a clock frequency divider.

Referring to FIG. 2, a generalized block diagram of a clock frequency divider 200 is shown. The clock frequency divider 200 includes a clock divider 210 and another clock divider 240 that receives an output of the clock divider 210. The clock frequency divider 200 receives two clock input signals such as the input clock signal 220 and the input clock signal 250, and generates two output clock signals such as output clock signal 230 and output clock signal 260. The clock frequency divider 200 additionally receives the reset signal 252, which is used by the clock divider 240 to generate the output clock signal 260. The reset signal 252 is asserted asynchronously with respect to the input clock signal 250. In various implementations, the clock dividers 210 and 240 and the signals 220, 230, 250 and 260 have equivalent characteristics and functionality as the dividers 110 and 140 and the signals 120, 130, 150 and 160 (of FIG. 1).

The clock divider 210 uses a data storage element, such as the flip-flop circuit (or flip-flop) 214, and the inverter 212. The output of the flip-flop 214 is sent to the input of the flip-flop 214 through the inverter 242. In such an implementation, the frequency of the output clock signal 230 is half of the frequency of the input clock signal 220. However, in other implementations, another number of flip-flops and inverters are used to generate another ratio of the frequency of the output clock signal 230 to the frequency of the input clock signal 220. This ratio is a positive, non-zero ratio that is less than one.

The clock divider 240 uses a flip-flop 244, which receives the output clock signal 230. Therefore, the flip-flop 244 stages the output clock signal 230 by one pipeline stage before being received by the combined multiplexer and flip-flop (combined mux-flop) circuit 246. The output of the flip-flop 244, which is an intermediate clock signal, is a pipelined version of the output clock signal 230. Although a single flip-flop is shown, in other implementations, the clock frequency divider 200 uses another number of flip-flops for pipeline staging based on the design requirements. The initial state of the flip-flop 214 is unknown. Similarly, the initial state of the flip-flop 244 and the initial state of the combined mux-flop 246 is unknown. Therefore, the states of the output clock signals 230 and 260 are unknown between power up of the clock frequency divider 200 and completion of a reset period. In one example, after power up, the first and second input clock signals 220 and 250 have an initial phase difference of 90 degrees. However, after power up, the flip-flop 214 generates an output state equal to a binary '0', whereas, the combined mux-flop 246 generates an output state equal to a binary '1," which causes an additional phase difference of 180 degrees. Therefore, until the reset period completes after power up, the first and second output clock signals 230 and 260 have a phase difference of 270 degrees, rather than a phase difference of 90 degrees equal to the initial phase difference between the first and second input clock signals 220 and 250. Accordingly, until the reset period completes, it is unknown whether the first and second output clock signals 230 and 260 have a phase difference between them that is equal to the initial phase difference between the first and second input clock signals 220 and 250.

External circuitry does not use synchronization circuitry for generating the reset signal 252. In order to generate the output clock signals 230 and 260 such that they have a phase difference between them that is equal to the initial phase difference between the first and second input clock signals 220 and 250, the clock divider 240 uses the combined mux-flop circuit 246. During the reset period when the reset signal 252 is asserted, the combined mux-flop circuit 246 performs steps to generate the output clock signal 260 such that a phase difference between the output clock signals 230 and 260 is equal to the initial phase difference between the first and second input clock signals 220 and 250. The combined mux-flop circuit 246 performs these steps while still meeting timing requirements of the clock frequency divider 200. The first input data signal of the combined mux-flop circuit 246, which is designated as "0," receives an inverted version of the output of the combined mux-flop circuit 246 through the inverter 242. The second input data signal of the combined mux-flop circuit 246, which is designated as "1," receives the output clock signal of the flip-flop 244. Therefore, the second input data signal of the combined mux-flop circuit 246 receives a pipeline staged version of the output clock signal 230.

Each of the input clock signals of the flip-flop 244 and the combined mux-flop circuit 246 receives the input clock signal 250. The input select signal of the combined mux-flop circuit 246 receives the reset signal 252. Although external circuitry asserts the reset signal asynchronously with respect to the input clock signal, the combined mux-flop circuit 246 generates the output clock signal 260 such that a phase difference between the output clock signals 230 and 260 is equal to the initial phase difference between the first and second input clock signals 220 and 250. For example, the combined mux-flop circuit 246 uses pass gates, rather than tri-state inverters, to convey data through the internal multiplexer to the internal flip-flop circuit. In addition, the internal flip-flop circuit of the combined mux-flop circuit 246 receives, with a pass gate, an output value from one of two pass gates of the internal multiplexer selected by the reset signal 252. Further details are provided in the following discussion of the circuitry of the combined mux-flop circuit 246.

Figure 3:
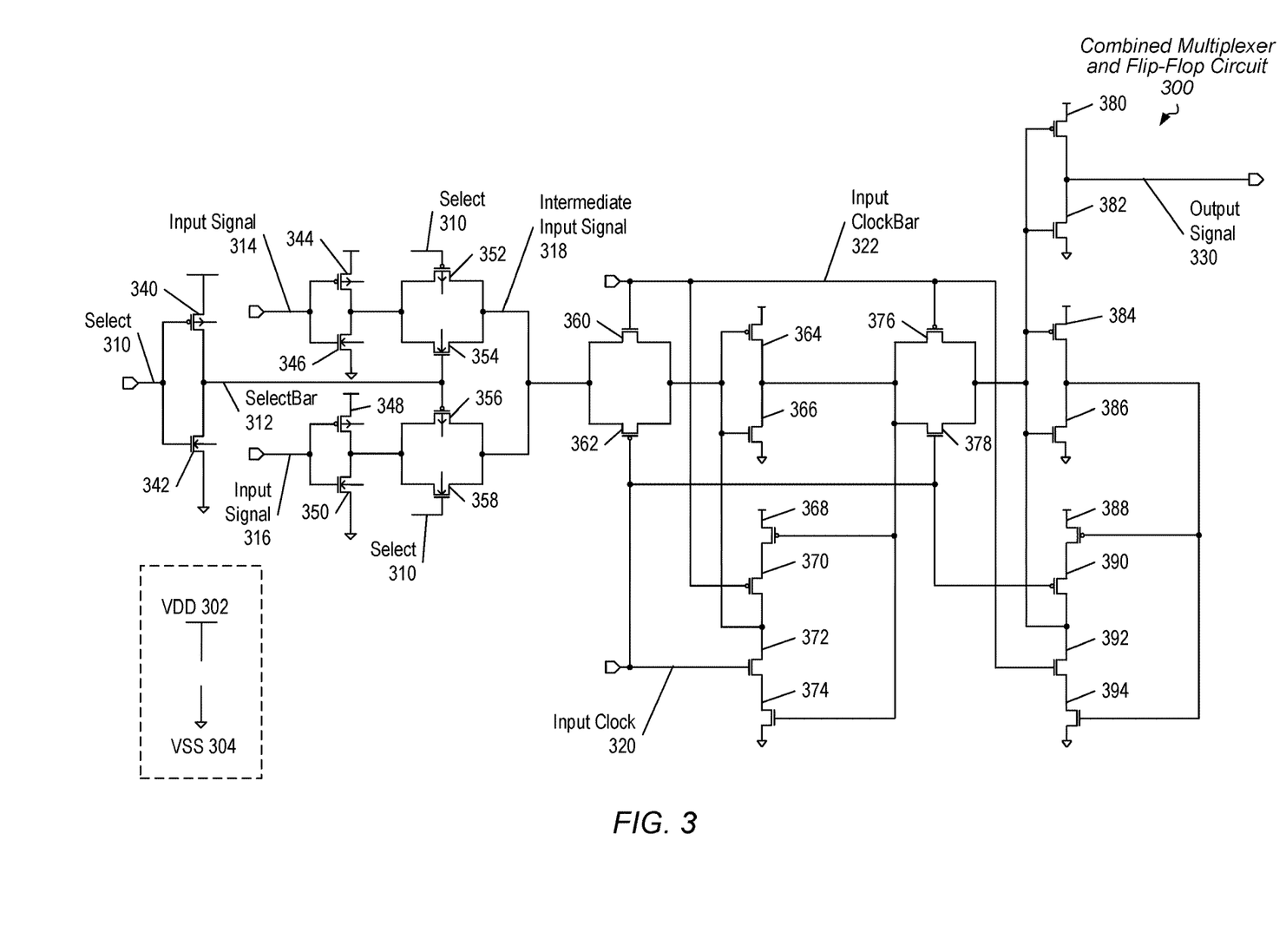
FIG. 3 is a generalized diagram of a combination multiplexer and flip-flop circuit.

Turning now to FIG. 3, a generalized block diagram of a combined multiplexer and flip-flop circuit 300 is shown. The combined multiplexer and flip-flop circuit 300 (or combined mux-flop circuit 300) includes multiple transistors. By using the transistors (or devices) 340-394, the combined mux-flop circuit 300 receives the input signal 314, the input signal 316, the select signal 310 and the input clock 320. The combined mux-flop circuit 300 generates the output signal 330. The transistors 340-356 implement the multiplexer. The transistors 360-394 implement the flip-flop circuit. The transistors use a power supply voltage reference level indicated by VDD 302. The transistors use a ground reference level indicated by VSS 304.

In various embodiments, the select signal 310 of the multiplexer is asserted asynchronously with respect to the input clock 320 of the flip-flop circuit. No synchronization circuitry is used between the select signal 310 and the combined mux-flop circuit 300. Despite the lack of using synchronization circuitry for the select signal 310, the combined mux-flop circuit 300 avoids glitches on circuit nodes by using pass gates in place of tri-state inverters. The p-type transistor 340 and the n-type transistor 342 are arranged as an inverter that receives the select signal 310 and generates the selectbar 312.

The multiplexer includes a first pass gate implemented by the p-type transistor 352 and the n-type transistor 354. The first pass gate receives an inverted version of the input signal 314 through the inverter implemented by the p-type transistor 344 and the n-type transistor 346. The multiplexer also includes a second pass gate implemented by the p-type transistor 356 and the n-type transistor 358. The second pass gate receives an inverted version of the input signal 316 through the inverter implemented by the p-type transistor 348 and the n-type transistor 350. These pass gates use the select signal 310 and the selectbar signal 312 as control signals. For example, each of the p-type transistor 352 and the n-type transistor 358 receives the select signal 310 on gate terminals, and each of the p-type transistor 356 and the n-type transistor 354 receives the selectbar signal 312 on gate terminals. Based on the selectbar signal 312 and the control signals select signal 310 and selectbar signal 312, one of the two pass gates is enabled and generates the output of the multiplexer, which is the intermediate input signal 318.

The flip-flop circuit uses a pass gate to receive the output of the multiplexer, which is the intermediate input signal 318. This pass gate is implemented by the p-type transistor 360 and the n-type transistor 362. Since the multiplexer and the flip-flop circuit are not from separate standard cells in a library, no intermediate inverters are used to buffer a signal between them. Therefore, latency is reduced as well as power consumption and on-die area. This pass gate of the flip-flop circuit uses the received input clock 320 and its inverted version input clockbar 322 as control signals. The p-type transistor 362 receives the input clock 320 on its gate terminal, and the n-type transistor 360 receives the on its gate terminal.

The pass gate of the flip-flop circuit conveys the output of the multiplexer to an inverter implemented by the p-type transistor 364 and the n-type transistor 366. This inverter is connected to a tri-state inverter in a back-to-back configuration. The tri-state inverter is implemented by the p-type transistor 368, the p-type transistor 370, the n-type transistor 372, and the n-type transistor 374. The p-type transistor 368 and the n-type transistor 374 receive on their gate terminals the output of the inverter. The p-type transistor 370 receives the input clockbar 322 on its gate terminal, whereas, the n-type transistor 372 receives the input clock 320 on its gate terminal. The transistors 360-374 implement the master latch of the flip-flop circuit.

The transistors 376-394 implement the slave latch of the flip-flop circuit. A pass gate of the slave latch receives the output of the back-to-back inverters. The p-type transistor 376 of the pass gate receives the input clockbar 322 on its gate terminal. The n-type transistor 378 of the pass gate receives the input clock 320 on its gate terminal. The pass gate conveys its output to a back-to-back inverter. A first inverter is implemented by the p-type transistor 384 and the n-type transistor 386. A tri-state inverter of the back-to-back configuration is implemented by the p-type transistors 388 and 390 as well as the n-type transistors 392 and 394. The pass gate also conveys its output to an inverter that generates the output signal 330 of the combined mux-flop circuit 300. The inverter is implemented by the p-type transistor 380 and the n-type transistor 382.

Figure 4:
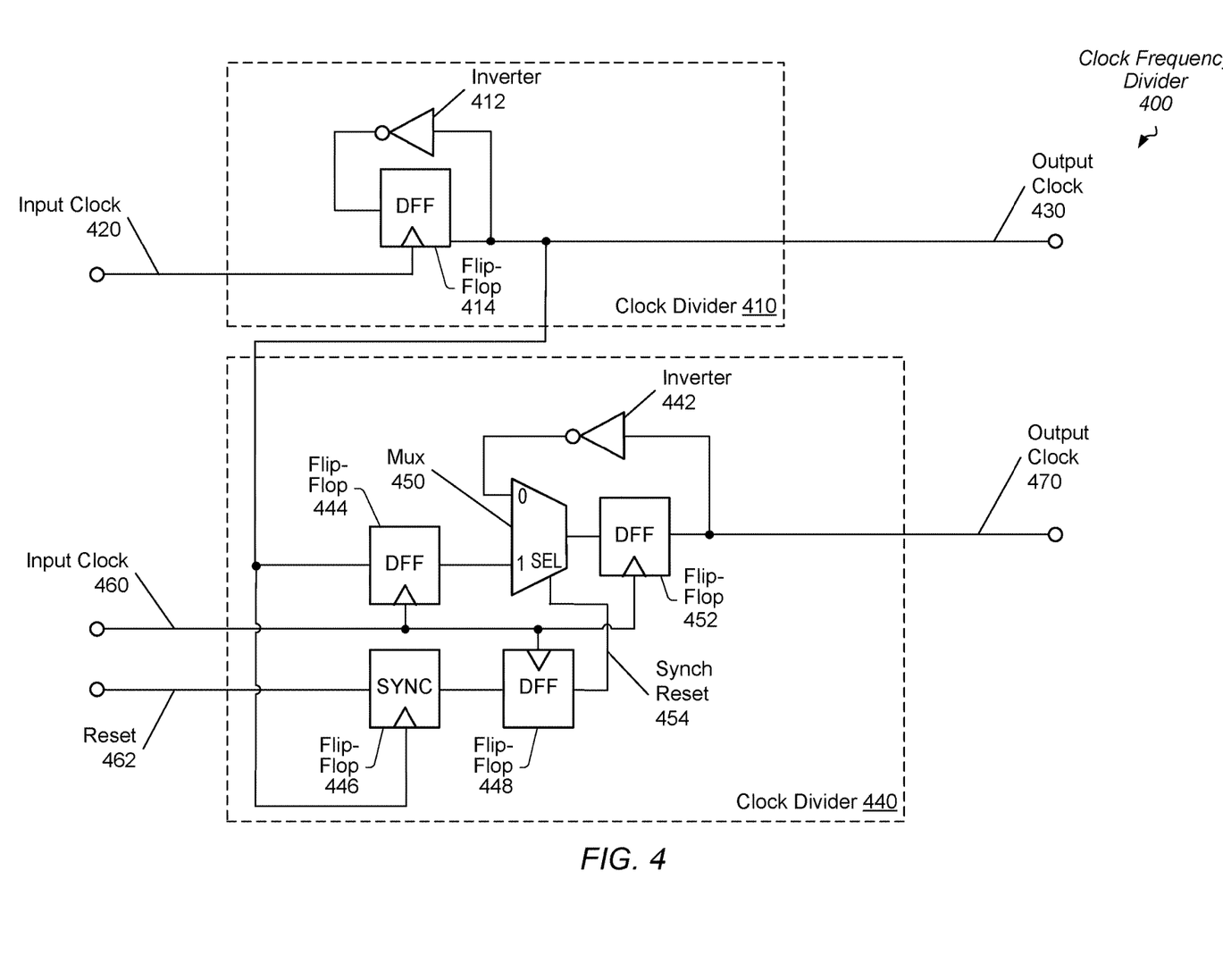
FIG. 4 is a generalized diagram of a clock frequency divider.

Referring to FIG. 4, a generalized block diagram of a clock frequency divider 400 is shown. The clock frequency divider 400 includes a clock divider 420 and another clock divider 440 that receives an output of the clock divider 410. Similar to the clock frequency divider 200 (of FIG. 2), the clock frequency divider 400 receives the reset signal 462, receives two clock input signals, such as the input clock signal 420 and the input clock signal 460, and generates two output clock signals such as output clock signal 430 and output clock signal 470. External circuitry asserts the reset signal 462 asynchronously with respect to the input clock signal 460. The output clock signal 430 has a frequency that is a fraction of the frequency of the input clock signal 420. The fraction is less than one. The clock divider 440 generates the output clock signal 470 based on the received reset signal 462. The output clock signal 470 has a frequency that is less than the frequency of the input clock signal 460.

The clock frequency divider 400 performs steps to generate the output clock signal 470 such that a phase difference between the output clock signals 430 and 470 is equal to the initial phase difference between the first and second input clock signals 420 and 460. However, the clock frequency divider 400 uses more circuitry and has more restrictive timing requirements than the clock frequency divider 200 (of FIG. 2). The clock divider 410 uses the inverter 412 and the flip-flop 414 in a similar manner as described earlier for the clock divider 210 (of FIG. 2). However, unlike the clock divider 240 (of FIG. 2), the clock divider 440 does not use a combined mux-flop circuit. Rather, the clock divider 440 uses other circuitry such as the multiplexer (mux) 450 separated from the flip-flop 452.

Since the multiplexer 450 is separated from the flip-flop 452, these circuits, which are from a library of standard cells, typically have an inverter at the input to receive signals and an inverter at the output to buffer signals. Accordingly, when used together, the separated multiplexer 450 and flip-flop 452 have more latency than the combined mux-flop circuit 246 (of FIG. 2). The separated multiplexer 450 and flip-flop 452 also consume more on-die are and consume more power than the combined mux-flop circuit 246. The first input data signal of the multiplexer 450, which is designated as "0," receives an inverted version of the output clock signal 470 through the inverter 442.

The second input data signal of the multiplexer 450, which is designated as "1," receives the output clock signal of the flip-flop 444. The flip-flop 444 of the clock divider 440 stages the output clock signal 430 by one pipeline stage before being received by the multiplexer 450. The output of the flip-flop 444, which is an intermediate clock signal, is a pipelined version of the output clock signal 430. Although a single flip-flop is shown, in other implementations, the clock frequency divider 400 uses another number of flip-flops for pipeline staging based on the design requirements.

It is possible that the separated multiplexer 450 and flip-flop 452 use tri-state inverters. Accordingly, the separated multiplexer 450 and flip-flop 452 are susceptible to glitches when an input signal arrives asynchronously with respect to another input signal. An example is the reset signal 462 arriving asynchronously with respect to the input clock signal 460. Therefore, the clock divider 440 uses at least the flip-flops 446 and 448 for receiving the reset signal 462 and generating the synch (synchronized) reset signal 454. Therefore, the sync reset signal 454 is a pipelined version of the reset signal 462.

It is noted that one or more of the flip-flops 446 and 448 are able to add more than one pipeline stage of delay between a data input signal and a data output signal. In one example, the flip-flop 446, which is a sync sequential element in the standard cell library, adds five pipeline stages, rather than a single pipeline stage. Alternatively, the clock divider 440 uses another number of flip-flops or other staging sequential elements to achieve a preferred delay. It is noted that the flip-flop 446 receives the data output signal of the flip-flop 414 as an input clock signal. In contrast, the flip-flop 448 receives the input clock signal 460 as an input clock signal.

During the reset period when the reset signal 462 is asserted, the clock divider 440 is able to generate the output clock signal 470 such that a phase difference between the output clock signals 430 and 470 is equal to the initial phase difference between the first and second input clock signals 420 and 460. However, the clock divider 440 has timing requirements not found in the clock divider 240 (of FIG. 2). For example, as clock periods of an integrated circuit reduce to improve performance, one or more timing paths begin to fail. One example of a timing path is a path from the clock-to-output delay of flip-flop 414 of clock divider 410, the clock-to-output delay of flip-flop 446 of clock divider 440, and the setup requirement of the flip-flop 448. Compared to the clock frequency divider 200 (of FIG. 2), the clock frequency divider 400 consumes more on-die are, consumes more power, and includes more timing restrictions. Therefore, the clock frequency divider 200 provides an asynchronous mechanism to reset the clock divider that receives the staged output clock signal from the other clock divider. This asynchronous mechanism to reset does not include the negative design tradeoffs such as increased on-die area, increased power consumption, possible signal glitches, and increased timing restrictions.

Figure 5:
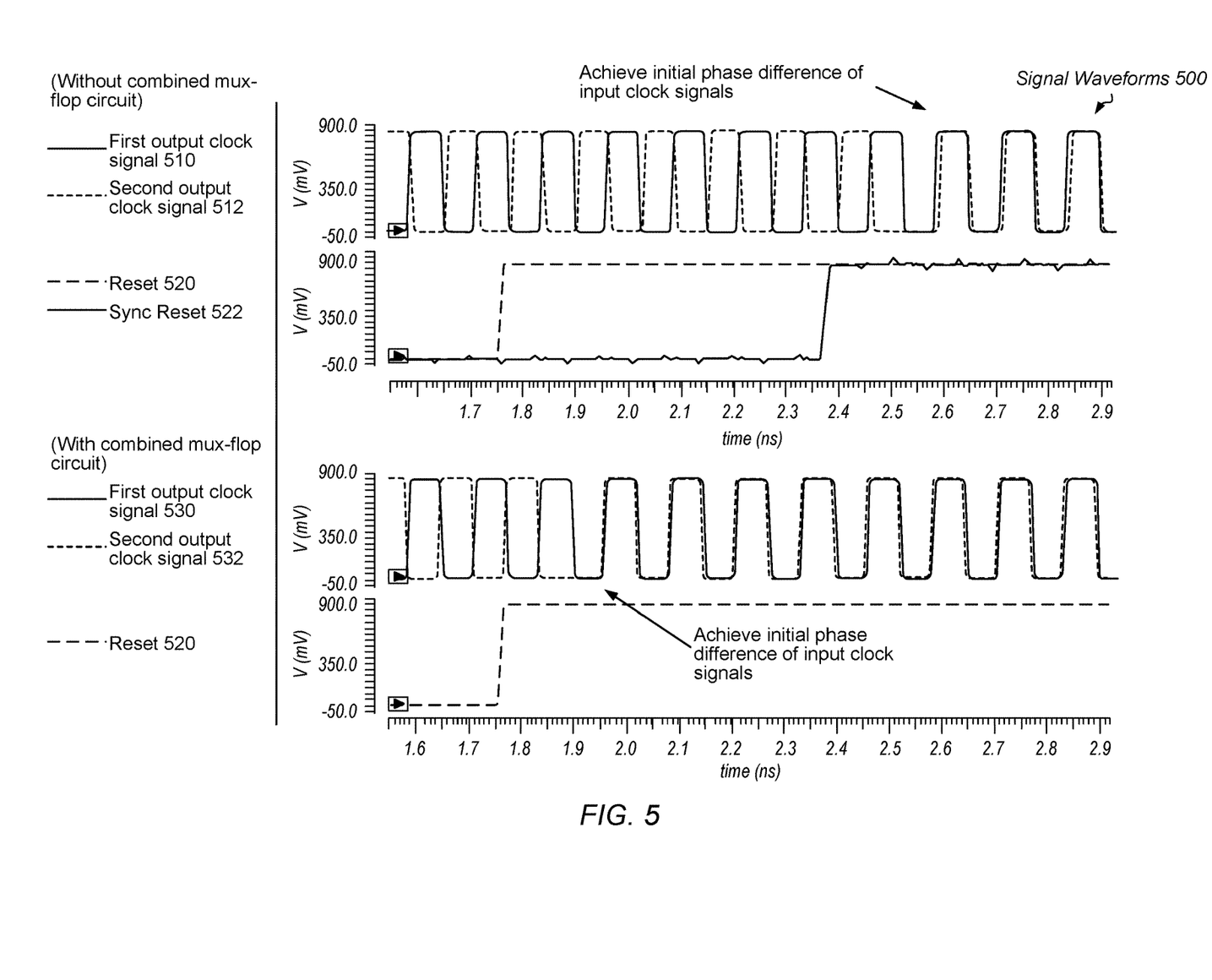
FIG. 5 is a generalized diagram of signal waveforms of an efficient clock frequency divider.

Turning now to FIG. 5, a generalized block diagram of signal waveforms 500 of an efficient clock frequency divider is shown. The signal waveforms 500 includes signals for two cases of implementing a clock frequency divider. A first set of signals at the top of the diagram illustrate signal waveforms for a clock frequency divider that does not utilize the combined mux-flop circuit such as the combined mux-flop circuit 246 (of FIG. 2) and the combined mux-flop circuit 300 (of FIG. 3). An example of such a clock frequency divider without the combined mux-flop circuit is the clock frequency divider 400 (of FIG. 4). A second set of signals at the bottom of the diagram illustrate signal waveforms for a clock frequency divider that does utilize the combined mux-flop circuit. An example of such a clock frequency divider is the clock frequency divider 200 (of FIG. 2). Each set of signal waveforms includes a measurement of voltage in units of millivolts (mV) on the y-axis and a measurement of time in units of nanoseconds (ns) on the x-axis. Although a particular range of values of voltage and time are shown, in other implementations, other ranges of values are possible and contemplated.

In one example of the case of a clock frequency divider that does not utilize the combined mux-flop circuit, the top set of signal waveforms include the first output clock signal 510, the second output clock signal 512, the reset signal 520, and the sync reset signal 522. In various implementations, the signals 510, 512, 520 and 522 are equivalent to the signals 430, 470, 462 and 454 (of FIG. 4), which were described earlier. As shown, the sync reset signal 522 is a delayed version of the reset signal 520. The amount of the delay is based on design requirements. For example, in some designs, this delay is based on increasing the parameter Mean Time Between Failures, or MTBF, indicates an average time interval between two successive failures of a particular element on a chip. As described earlier, the flip-flops 446 and 448 (of FIG. 4) provide the amount of delay between a resent signal 462 and the corresponding sync reset signal 454.

The input clock signals are not shown for ease of illustration. However, in the illustrated implementation, the initial phase difference between the input clock signals is zero degrees. The initial states of the clock dividers that generate the output clock signals 510 and 512 do not match one another. For example, a first clock divider that generates the output clock signal 510 initially generates an output state equal to a binary '0' after power up, whereas, a second clock divider that generates the output clock signal 512 initially generates an output state equal to a binary '1,' after power up. Therefore, the output clock signals 510 and 512 have an additional phase difference of 180 degrees in addition to the initial phase difference between the input clock signals (not shown). Since the input clock signals have an initial phase difference of 0 degrees, the phase difference between the output clock signals 510 and 512 have a phase difference of 180 degrees (0 degrees of the initial phase difference of the input clock signals and the 180 degrees of the additional phase difference after power up). However, shortly after the sync reset signal 522 is asserted, the additional phase difference of 180 degrees is removed, and only the initial phase difference of 0 degrees remains between the output clock signals 510 and 512. Without using the combined mux-flop circuit, though, the resulting clock frequency divider consumes more on-die are, consumes more power, and includes more timing restrictions than a clock frequency divider that uses the combined mux-flop circuit.

In one example of the case of a clock frequency divider that does utilize the combined mux-flop circuit, the bottom set of signal waveforms includes the first output clock signal 530, the second output clock signal 532, and the reset signal 520. In various implementations, the signals 530, 532 and 520 are equivalent to the signals 230, 260 and 252 (of FIG. 2), which were described earlier. Similar to the above description for the output clock signals 510 and 512, in this case, the initial phase difference between the input clock signals (not shown) is zero degrees, and the initial states of the clock dividers that generate the output clock signals 530 and 532 do not match one another. Therefore, the output clock signals 530 and 532 have an additional phase difference of 180 degrees in addition to the initial phase difference of 0 degrees between the input clock signals (not shown). In this case, the reset signal 520 directly controls when the output clock signals 530 and 532 have the additional phase difference of 180 degrees removed without relying on an output of external synchronization circuitry such as the sync reset signal 522.

The output clock signals 530 and 532 are originally out of phase with respect to one another. As shown, the clock frequency divider begins generating the output clock signals 530 and 532 in the same given clock cycle as the given clock cycle when the reset signal 520 is asserted. No additional clock cycles of an input clock signal received by the second clock divider are inserted between the reset signal 520 being asserted and the second clock divider generating the output clock signal 532. Therefore, shortly after the reset signal 520 is asserted, the output clock signals 530 and 532 have the additional phase difference of 180 degrees removed by the clock frequency divider, and only the initial phase difference of 0 degrees remains between the output clock signals 530 and 532. By using the combined mux-flop circuit, the resulting clock frequency divider avoids the undesirable design traits described above regarding on-die are, power consumption, and timing restrictions.

Figure 6:
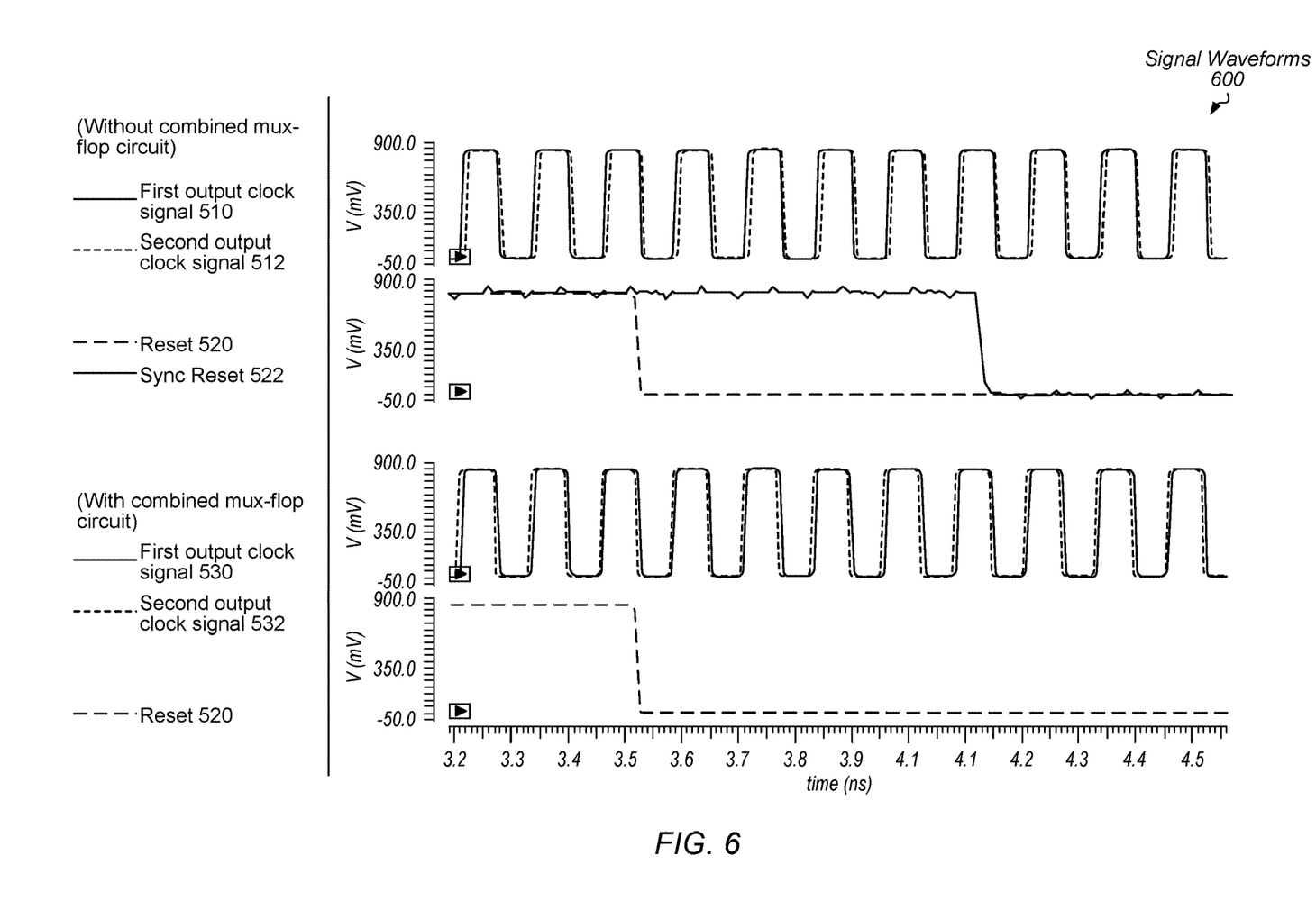
FIG. 6 is a generalized diagram of signal waveforms of an efficient clock frequency divider.

Turning now to FIG. 6, a generalized block diagram of signal waveforms 600 of an efficient clock frequency divider is shown. Signals described earlier are numbered identically. The signal waveforms 600 are a continuation of the reset mechanism for clock frequency dividers and the signal waveforms 500 (of FIG. 5). During the reset period while the reset signal 520 is asserted, the clock frequency divider removes any additional phase difference from the output clock signals 510 and 512. The same is true for the output clock signals 530 and 532. After an amount of delay determined by design requirements, the reset signal 520 is negated. Shortly after the reset signal 520 is negated, only the initial phase difference of 0 degrees exists between the output clock signals 510 and 512. The same is true for the output clock signals 530 and 532.

As used herein, a signal on a circuit node or line is "asserted" when the node or line stores a voltage level that enables a transistor that receives the voltage level, or the voltage level indicates an operation is enabled. For example, an n-type transistor is enabled when the n-type transistor receives a positive, non-zero voltage level on its gate terminal that is at least a threshold voltage above a voltage level on its source terminal. As used herein, the signal on the circuit node or line is "negated" when the node or line stores a voltage level that disables a transistor that receives the voltage level. An n-type transistor is disabled when the n-type transistor receives a voltage level on its gate terminal that is a threshold voltage below a voltage level on its source terminal. Similarly, a p-type transistor is enabled when the p-type transistor receives a voltage level on its gate terminal that is at least a threshold voltage below a voltage level on its source terminal. The p-type transistor is negated when the p-type transistor receives a voltage level on its gate terminal that is at least a threshold voltage above a voltage level on its source terminal. Additionally, operations are enabled and disabled based on corresponding control signals being asserter or negated.

Figure 7:
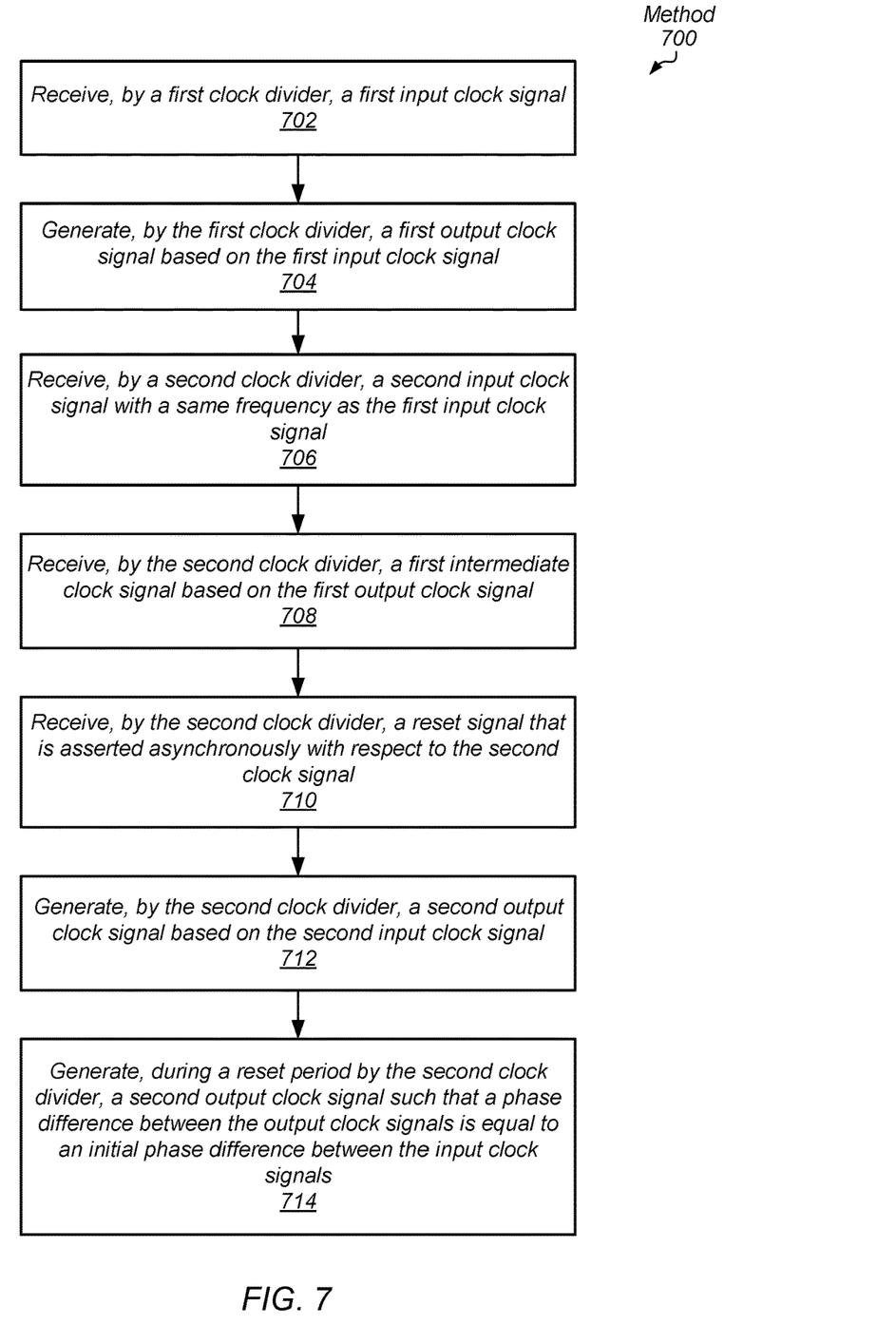
FIG. 7 is a generalized diagram of one implementation of a method for efficiently generating clock signals.

Referring now to FIG. 7, one implementation of a method 700 is shown for efficiently generating clock signals. For purposes of discussion, the steps in this implementation (as well as FIG. 8) are shown in sequential order. However, in other implementations some steps occur in a different order than shown, some steps are performed concurrently, some steps are combined with other steps, and some steps are absent.

An integrated circuit includes multiple clock frequency dividers both at its I/O boundaries and within its die. In various implementations, one or more of the clock frequency dividers utilize a first clock divider and a second clock divider. The first clock divider receives a first input clock signal (block 702). The first clock divider generates a first output clock signal based on the first input clock signal (block 704). For example, the first clock divider generates the first output clock signal with a fraction of the frequency of the first input clock signal where the fraction is a positive, non-zero ratio less than one. The second clock divider receives a second input clock signal with a same frequency as the first input clock signal (block 706). The first input clock signal and the second input clock signal have an initial phase difference between them. In some designs, the initial phase difference is zero degrees. In other designs, the initial phase difference is a positive, non-zero number of degrees. The second clock divider receives a first intermediate clock signal based on the first output clock signal (block 708). In an implementation, the first intermediate clock signal is a pipelined version of the first output clock signal. For example, one or more flip-flop circuits are used between the first clock divider and the second clock divider.

The second clock divider receives a reset signal that is asserted asynchronously with respect to the second input clock signal (block 710). Therefore, no synchronization circuitry is used between the reset signal and the second clock divider. For example, the second clock divider receives the reset signal in a given clock cycle of the second input clock signal, and in this given clock cycle, the second clock divider generates a second output clock signal based on the second input clock signal (block 712). The second clock divider generates the second output clock signal with a fraction of the frequency of the second input clock signal where the fraction is a positive, non-zero ratio less than one. In some implementations, the first output clock signal has a same frequency as the second output clock signal. For example, each of the first clock divider and the second clock divider uses a same positive, non-zero divisor for generating the output clock signals. In other implementations, the first output clock signal has a different frequency than the second output clock signal. For example, the first clock divider and the second clock divider use different positive, non-zero divisors for generating the output clock signals.

During a reset period when the received reset signal is asserted, such as in the given clock cycle of the second input clock signal, the second clock divider generates the second output signal such that a phase difference between the output clock signals is equal to the initial phase difference between the input clock signals (block 714). The second clock divider performs this generation during the reset period despite the reset signal being asserted asynchronously with respect to the second input clock signal and there is no synchronization circuitry between the reset signal and the second clock divider.

Figure 8:
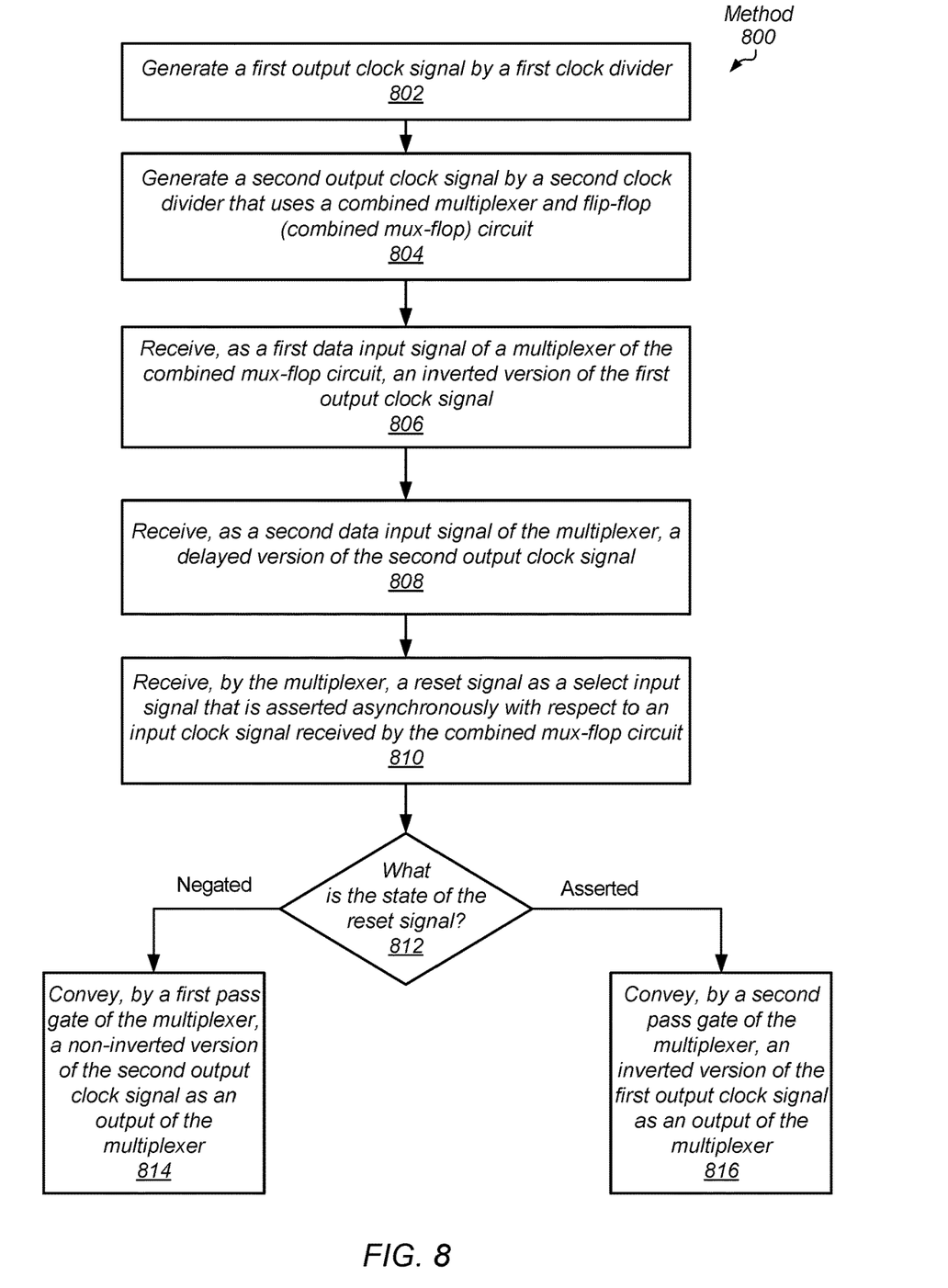
FIG. 8 is a generalized diagram of one implementation of a method for efficiently generating clock signals.

Referring now to FIG. 8, one implementation of a method 800 is shown for efficiently generating clock signals. One or more clock frequency dividers utilize a first clock divider and a second clock divider. The first clock divider generates a first output clock signal (block 802). The second clock divider generates a second output clock signal (block 804), and the second clock divider uses a combined multiplexer and flip-flop (combined mux-flop) circuit. The first output clock signal has a frequency that is a fraction of the frequency of the first input clock signal. Similarly, second output clock signal has a frequency that is a fraction of the frequency of the second input clock signal. These fractions are positive, non-zero ratios that are less than one. The first and second input clock signals have a same input frequency. Additionally, the first and second input signals have an initial phase difference between them. In some cases, this initial phase difference is zero degrees. In other cases, this initial phase difference is a positive, non-zero number of degrees.

The multiplexer of the combined mux-flop circuit receives, as a first data input signal, an inverted version of the first output clock signal of a first clock divider (block 806). The multiplexer receives, as a second data input signal, a delayed version of a second output clock signal of a second clock divider (block 808). The multiplexer receives a reset signal as a select input signal that is asserted asynchronously with respect to an input clock signal received by the combined mux-flop circuit (block 810). For example, this input clock signal is the second input clock signal of the second clock divider.

If the state of the reset signal is a negated value ("negated" branch of the conditional block 812), then a first pass gate of the multiplexer conveys a non-inverted version of the second output clock signal as an output of the multiplexer (block 814). If the state of the reset signal is an asserted value ("asserted" branch of the conditional block 812), then a second pass gate of the multiplexer conveys an inverted version of the first output clock signal as an output of the multiplexer (block 816).

Figure 9:
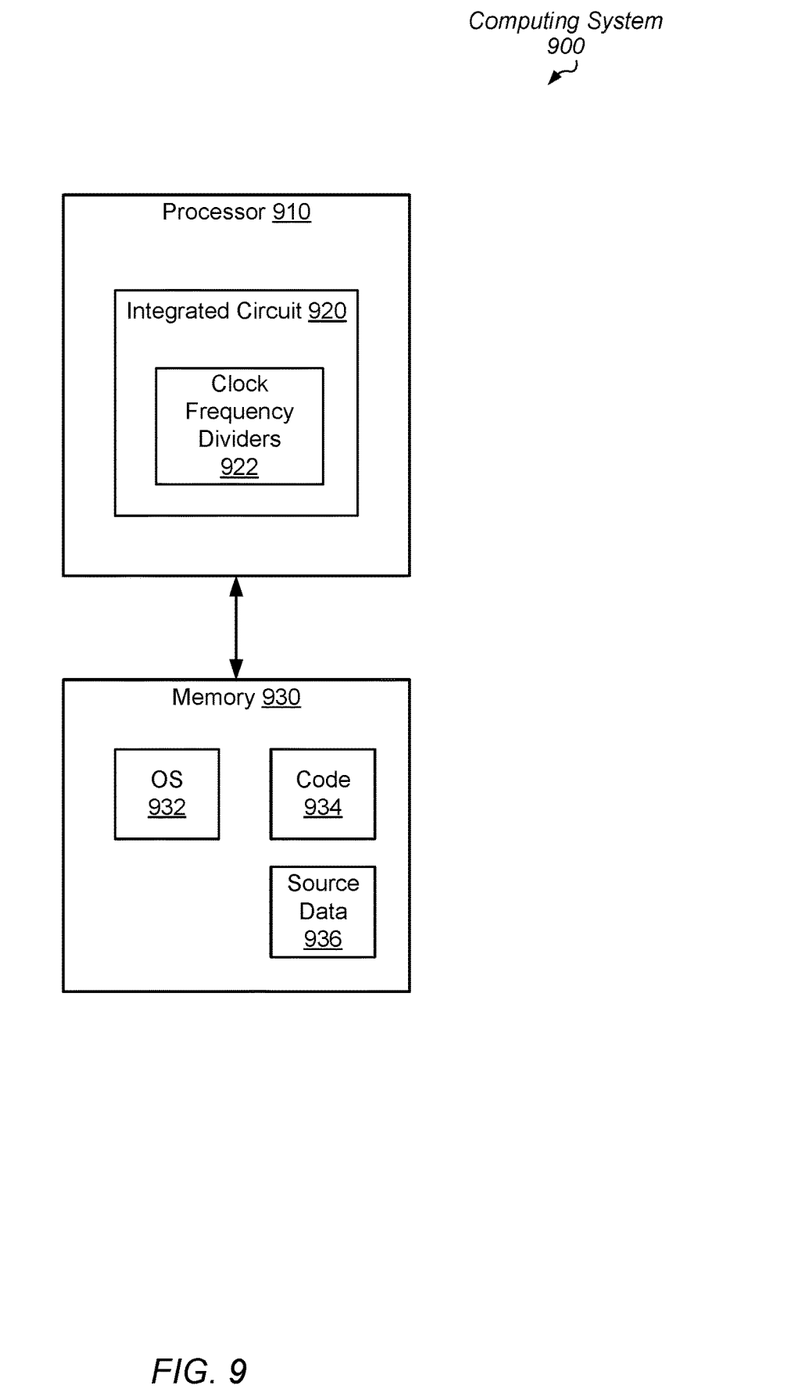
FIG. 9 is a generalized diagram of a computing system with efficient clock frequency dividers.

Turning now to FIG. 9, a generalized block diagram of computing system 900 with efficient clock frequency dividers is shown. The computing system 900 includes the processor 910 and the memory 930. Interfaces, such as a memory controller, a bus or a communication fabric, one or more phased locked loops (PLLs) and other clock generation circuitry, a power management unit, and so forth, are not shown for ease of illustration. It is understood that in other implementations, the computing system 900 includes one or more of other processors of a same type or a different type than processor 910, one or more peripheral devices, a network interface, one or more other memory devices, and so forth. In some implementations, the functionality of the computing system 900 is incorporated on a system on chip (SoC). In other implementations, the functionality of the computing system 900 is incorporated on a peripheral card inserted in a motherboard. The computing system 900 is used in any of a variety of computing devices such as a desktop computer, a tablet computer, a laptop, a smartphone, a smartwatch, a gaming console, a personal assistant device, and so forth.

The processor 910 includes hardware such as circuitry. For example, the processor 910 includes at least one integrated circuit 920, which utilizes clock frequency dividers 922. The integrated circuit 920 includes the clock frequency dividers 922 both at its I/O boundaries and within its die. One or more of the clock frequency dividers 922 utilize the circuitry of the clock frequency divider 100 (of FIG. 1), the clock frequency divider 200 (of FIG. 2), and the combined multiplexer and flip-flop circuit 300 (of FIG. 3). It is contemplated that the integrated circuit 920 includes any number of clock frequency dividers.

In various implementations, the processor 910 includes one or more processing units. In some implementations, each of the processing units includes one or more processor cores capable of general-purpose data processing, and an associated cache memory subsystem. In such an implementation, the processor 910 is a central processing unit (CPU). In another implementation, the processing cores are compute units, each with a highly parallel data microarchitecture with multiple parallel execution lanes and an associated data storage buffer. In such an implementation, the processor 910 is a graphics processing unit (GPU), a digital signal processor (DSP), or other.

In some implementations, the memory 930 includes one or more of a hard disk drive, a solid-state disk, other types of flash memory, a portable solid-state drive, a tape drive and so on. The memory 930 stores an operating system (OS) 932, one or more applications represented by code 934, and at least source data 936. Memory 930 is also capable of storing intermediate result data and final result data generated by the processor 910 when executing a particular application of code 934. Although a single operating system 932 and a single instance of code 934 and source data 936 are shown, in other implementations, another number of these software components are stored in memory 930. The operating system 932 includes instructions for initiating the boot up of the processor 910, assigning tasks to hardware circuitry, managing resources of the computing system 900 and hosting one or more virtual environments.

Each of the processor 910 and the memory 930 includes an interface unit for communicating with one another as well as any other hardware components included in the computing system 900. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage.

Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:
1. An apparatus comprising:
a first clock divider circuit configured to:
receive a first input clock signal; and
generate a first output clock signal based on the first input clock signal; and
a second clock divider circuit configured to:
receive a second input clock signal, wherein the first input clock signal and the second input clock signal have an initial phase difference between them;
receive a first intermediate clock signal based on the first output clock signal;
receive a reset signal that is asserted asynchronously, in a given clock cycle of the second input clock signal, with respect to the second input clock signal; and
in response to assertion of the reset signal, generate, in the given clock cycle, a second output clock signal such that the first output clock signal and the second output clock signal have the initial phase difference between them.

2. The apparatus as recited in claim 1, wherein a first input frequency of the first input clock signal is equal to a second input frequency of the second input clock signal.

3. The apparatus as recited in claim 1, further comprising a sequential element comprising circuitry configured to:
receive the first output clock signal as a data input signal;
receive the second input clock signal; and
generate the first intermediate clock signal to convey to the second clock divider circuit.

4. The apparatus as recited in claim 1, wherein the second clock divider circuit comprises a multiplexer circuit configured to:
receive the reset signal, in the given clock cycle, as a select input signal; and
generate, in the given clock cycle, a second intermediate clock signal.

5. The apparatus as recited in claim 4, wherein the multiplexer circuit comprises:
a first pass gate circuit configured to:
receive an inverted version of the second output clock signal as a first data input signal; and
convey, in the given clock cycle, a non-inverted version of the second output clock signal as the second intermediate clock signal, responsive to the reset signal being negated; and
a second pass gate circuit configured to:
receive the first intermediate clock signal as a second data input signal; and
convey, in the given clock cycle, an inverted version of the first intermediate clock signal as the second intermediate clock signal, responsive to assertion of the reset signal.

6. The apparatus as recited in claim 5, wherein the second clock divider circuit comprises a sequential element comprising circuitry configured to:
receive the second intermediate clock signal as a data input signal;
receive the second input clock signal; and
generate the second output clock signal.

7. The apparatus as recited in claim 6, wherein the sequential element of the second clock divider circuit comprises a third pass gate circuit configured to receive the second intermediate clock signal from one of the first pass gate circuit and the second pass gate circuit of the multiplexer circuit.

8. A method comprising:
receiving, by a first clock divider circuit, a first input clock signal;
generating, by the first clock divider circuit, a first output clock signal based on the first input clock signal;

receiving, by a second clock divider circuit, a second input clock signal, wherein the first input clock signal and the second input clock signal have an initial phase difference between them;

receiving, by the second clock divider circuit, a first intermediate clock signal based on the first output clock signal;

receiving, by the second clock divider circuit, a reset signal that is asserted asynchronously, in a given clock cycle of the second input clock signal, with respect to the second input clock signal; and in response to the reset signal being asserted, generating, in the given clock cycle by the second clock divider circuit, a second output clock signal such that the first output clock signal and the second output clock signal have the initial phase difference between them.

9. The method as recited in claim 8, wherein a first input frequency of the first input clock signal is equal to a second input frequency of the second input clock signal.

10. The method as recited in claim 8, further comprising:
receiving, by a sequential element circuit, the first output clock signal as a data input signal;
receiving, by the sequential element circuit, the second input clock signal; and
generating, by the sequential element circuit, the first intermediate clock signal to convey to the second clock divider circuit.

11. The method as recited in claim 8, further comprising:
receiving, by a multiplexer circuit of the second clock divider circuit, the reset signal, in the given clock cycle, as a select input signal; and
generating, in the given clock cycle by the multiplexer circuit, a second intermediate clock signal.

12. The method as recited in claim 11, further comprising:
receiving, by a first pass gate circuit of the multiplexer circuit, an inverted version of the second output clock signal as a first data input signal;
conveying, in the given clock cycle by the first pass gate circuit of the multiplexer circuit, a non-inverted version of the second output clock signal as the second intermediate clock signal, responsive to the reset signal being negated;
receiving, by a second pass gate circuit of the multiplexer circuit, the first intermediate clock signal as a second data input signal; and
conveying, in the given clock cycle by the second pass gate circuit of the multiplexer circuit, an inverted version of the first intermediate clock signal as the second intermediate clock signal, responsive to the reset signal being asserted.

13. The method as recited in claim 12, further comprising:
receiving, by a sequential element circuit of the second clock divider circuit, the second intermediate clock signal as a data input signal;
receiving, by the sequential element circuit, the second input clock signal; and
generating, by the sequential element circuit, the second output clock signal.

14. The method as recited in claim 13, further comprising receiving, by a third pass gate circuit of the sequential element circuit, the second intermediate clock signal from one of the first pass gate circuit and the second pass gate circuit of the multiplexer circuit.

15. A computing system comprising:
a memory configured to store instructions of one or more tasks and source data to be processed by the one or more tasks;
an integrated circuit configured to execute the instructions using the source data, wherein the integrated circuit comprises one or more clock frequency dividers, each comprising:
a first clock divider circuit configured to:
receive a first input clock signal; and
generate a first output clock signal based on the first input clock signal; and
a second clock divider circuit configured to:
receive a second input clock signal, wherein the first input clock signal and the second input clock signal have an initial phase difference between them;
receive a first intermediate clock signal based on the first output clock signal;
receive a reset signal that is asserted asynchronously, in a given clock cycle of the second input clock signal, with respect to the second input clock signal; and
in response to assertion of the reset signal, generate, in the given clock cycle, a second output clock signal such that the first output clock signal and the second output clock signal have the initial phase difference between them.

16. The computing system as recited in claim 15, wherein a given clock frequency divider circuit of the one or more clock frequency dividers comprises a sequential element circuit configured to:
receive the first output clock signal as a data input signal;
receive the second input clock signal; and
generate the first intermediate clock signal to convey to the second clock divider circuit.

17. The computing system as recited in claim 15, wherein the second clock divider circuit comprises a multiplexer circuit configured to:
receive the reset signal, in the given clock cycle, as a select input signal; and
generate, in the given clock cycle, a second intermediate clock signal.

18. The computing system as recited in claim 17, wherein the multiplexer circuit comprises:
a first pass gate circuit configured to:
receive an inverted version of the second output clock signal as a first data input signal; and
convey, in the given clock cycle, a non-inverted version of the second output clock signal as the second intermediate clock signal, responsive to the reset signal being negated; and
a second pass gate circuit configured to:
receive the first intermediate clock signal as a second data input signal; and
convey, in the given clock cycle, an inverted version of the first intermediate clock signal as the second intermediate clock signal, responsive to the reset signal being asserted.

19. The computing system as recited in claim 18, wherein the second clock divider circuit comprises a sequential element circuit configured to:
receive the second intermediate clock signal as a data input signal;
receive the second input clock signal; and
generate the second output clock signal.

20. The computing system as recited in claim 19, wherein the sequential element circuit of the second clock divider circuit comprises a third pass gate circuit configured to receive the second intermediate clock signal from one of the first pass gate circuit and the second pass gate circuit of the multiplexer circuit.

\* \* \* \* \*